(12) United States Patent
Manna et al.

(10) Patent No.: US 8,358,548 B2
(45) Date of Patent: Jan. 22, 2013

(54) METHODS FOR EFFICIENTLY REPAIRING EMBEDDED DYNAMIC RANDOM-ACCESS MEMORY HAVING MARGINALLY FAILING CELLS

(75) Inventors: Indrajit Manna, Fort Collins, CO (US); James Pfiester, Fort Collins, CO (US); David Leary, Loveland, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 387 days.

(21) Appl. No.: 12/581,202

(22) Filed: Oct. 19, 2009

(65) Prior Publication Data

US 2011/0090751 A1 Apr. 21, 2011

(51) Int. Cl.
*G11C 29/00* (2006.01)
(52) U.S. Cl. .................................. 365/200; 365/201
(58) Field of Classification Search .................. None
See application file for complete search history.

(56) References Cited

U.S. PATENT DOCUMENTS

| | | | | |
|---|---|---|---|---|
| 5,058,069 | A * | 10/1991 | Gaultier et al. | 365/200 |
| 5,883,843 | A * | 3/1999 | Hii et al. | 365/201 |
| 6,181,614 | B1 | 1/2001 | Aipperspach et al. | |
| 6,574,760 | B1 * | 6/2003 | Mydill | 714/724 |
| 6,940,766 | B2 | 9/2005 | Konuk et al. | |
| 7,000,156 | B2 * | 2/2006 | Shimada et al. | 714/711 |
| 7,370,251 | B2 | 5/2008 | Nadeau-Dostie et al. | |
| 7,444,564 | B2 | 10/2008 | Anand et al. | |
| 7,484,138 | B2 | 1/2009 | Hsieh et al. | |
| 2005/0066226 | A1 | 3/2005 | Adams et al. | |
| 2005/0083739 | A1 | 4/2005 | Callaway et al. | |
| 2008/0270675 | A1 | 10/2008 | Nagaraj et al. | |

OTHER PUBLICATIONS

Kim et al., "A BISR circuit for embedded memory", IEEE 1999, pp. 602-605.*
JEDEC DDR SDRAM Standard, "JESD79E", May 2005.*
JEDEC DDR SDRAM Standard, JESD79E, May2005. Provided in 1st Office Action.*
Kim et al., "A BISR circuit for embedded memory", IEEE 1999, pp. 602-605. Provided in 1st Office Action.*
JEDEC DDR SDRAM Standard, JESD79E, May 2005. Provided in 1st Office Action.*

* cited by examiner

*Primary Examiner* — Amir Zarabian
*Assistant Examiner* — James G Norman

(57) ABSTRACT

A test system and a method for efficiently repairing marginally failing memory cells in an embedded dynamic random access memory on an integrated circuit identify marginally failing cells in the embedded memory and when two or more marginally failing cells are located in the same column, indicating a partial column failure due to a weak sense amplifier associated with the column, the system and method apply a spare column preferentially to repair the failing cells in the column. The test system can be arranged in a built-in self test engine on the integrated circuit. In an alternative embodiment, the test system can be implemented in test equipment coupled to the integrated circuit that houses the embedded dynamic random-access memory.

8 Claims, 7 Drawing Sheets

METHODS FOR EFFICIENTLY REPAIRING EMBEDDED DYNAMIC RANDOM-ACCESS MEMORY HAVING MARGINALLY FAILING CELLS

BACKGROUND

Semiconductor memories generally include a multitude of memory cells arranged in rows and columns Each memory cell is structured for storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Manufacturing lines for integrated circuits are inherently imperfect and invariably introduce defects into circuits etched onto a silicon wafer. Integrated circuit memories are among the densest forms of semiconductor structures. Integrated circuit memories may be stand-alone packaged devices, or may be embedded on logic, system on chip (SOC), or processor chips. As memories become larger, the shear amount of circuitry presents an increasing probability that each memory circuit will contain one or more defects. The density and distribution of manufacturing defects across a silicon wafer may cause a high percentage of memory circuits to have defects while the remaining logic portion of the chip is devoid of defects. To address the defective memories and to enhance chip yield, spare memory elements have been added to integrated memory. The spare memory elements are normally in the form of extra rows or columns of memory cells broadly referred to as "redundancy."

Built-in self-test (BIST) logic has emerged as a technique for testing chips with embedded memories. BIST logic resides on the chip, and provides stimulus to the memory in the form of various test patterns selected to detect known manufacturing defects. The BIST logic may also examine the memory outputs to evaluate whether the circuitry is functioning properly in response to the provided test pattern. For a memory without redundancy, the detection of a failure means that the chip must be discarded. For a memory with redundancy, the redundant elements may be allocated to the defective memory location(s). For memories with multiple dimensions of redundancy, e.g. spare rows and columns, the self-test logic must make a decision whether to allocate a row or a column for each defective cell location in the memory.

Redundancy can be implemented at the time of manufacture via "hard" implementation techniques. These techniques include allocating redundancy and modifying the integrated circuit to enable appropriate connections. This repair process associates the redundant element(s) with the defective memory locations from then on during the life of the chip. Redundancy can also be implemented via "soft" means where a BIST is executed and redundancy is enabled at each power up of the chip. The soft redundancy calculation information is not retained once power is removed from the chip.

During test, if a single cell failure is encountered; either a spare row or a spare column can be used to repair the memory device. A number of algorithms have been described for repairing a memory device.

In a BIST environment, often deployed to verify a system on a chip, it is not practical to store all of the failing locations since a large memory may be required. Indeed, since BIST functions are ancillary to the purpose for which an integrated circuit is designed, very little space is typically allocated. Instead, the BIST logic must make a determination part way through the testing as to which redundant element dimension to use to repair an identified fault. Historically, several BIST solutions have been employed.

One BIST solution is the arbitrary implementation of redundant elements. In this case, the first failure might have a row allocated to replace the memory cell associated with the failed bit, with the next failed bit being replaced by a column of memory cells, and so on. An arbitrary replacement scheme clearly would not lead to an optimal repair since, for example, a row failure might have a column arbitrarily allocated to a failed element in the row, which would fail to repair the entire row. More generally, an arbitrary scheme may fail to repair a chip that is in fact repairable with the existing redundancy. When non-optimal redundancy implementation techniques are utilized, the yield is diminished since chips which are repairable end up not being repaired. Viable redundancy solutions may be missed when applying a limited redundancy calculation algorithm to a memory having a limited number of redundant elements.

Another BIST environment solution is to place a counter on each one of the columns and count the number of cell failures on each. Based on this fault count, a column with more faults than available redundant rows would be selected as a must-fix column for redundancy repair. Then must-fix rows would be identified. These redundancy calculations would be followed up by repairing remaining failures with any available spare columns and spare rows.

Another method allocates spare rows or columns based on the number of faulty cells detected in a row or column of the memory. A row or column with a larger number of faults is ranked higher than a row or column with a lesser number of faults. Spare rows or columns are allocated in accordance with the recorded rank. This method treats each fault as a hard defect and does not identify marginally failing bits or partial column failures in the memory.

U.S. Pat. No. 6,181,614 illustrates and describes a circuit arrangement and method for dynamically repairing a redundant memory array by using a combination of dynamically-determined repair information, generated from a memory test performed on the redundant memory array, along with persistently-stored repair information to repair the redundant memory array. U.S. Patent Application Publication 2005/0083739 describes a system and a method for dynamically repairing a semiconductor memory. The system includes circuitry for dynamically storing memory element remapping information. Memory is dynamically reprogrammed in order to remap unused spare memory elements for failed memory elements when errors are detected. Unused spare memory elements are remapped utilizing a circuit that overrides functional fuses. While these circuits, systems, and methods have introduced improvements, they are based on the assumption that detected faults are "hard" or permanent defects in the memory.

For a stand alone memory chip, the whole memory may be tested with all of the failing locations identified by an external tester. Once all of the failing locations are identified, various redundancy solutions are exercised via software simulation means prior to implementing any of the redundancy in hardware. Often, all possible solutions are exercised prior to selecting the redundancy solution to implement. Such a repair algorithm is described in U.S. Pat. No. 6,940,766. The repair algorithm stores an entire defect matrix, which is applied to a repair algorithm until a repair solution is identified or all redundancies are exhausted. However, embedded memories may not be directly or conveniently accessible by an external tester. In addition, the methodology assumes that detected faults are permanent.

Other approaches to the allocation of redundant elements in a BIST environment have been tried. However, they generally suffer from excessive on-chip logic for the redundancy calculation, result in an efficient redundancy implementation determination, or a combination of both.

SUMMARY

An embodiment of a test system for efficiently repairing embedded dynamic random-access memory (DRAM) elements having marginally failing cells includes a built-in self test (BIST) engine arranged on an integrated circuit, the BIST engine arranged to address, read from, and write to, individual memory cells within a defined DRAM on the integrated circuit and firmware accessible by the BIST engine, the firmware including a set of executable instructions that when accessed and executed by the BIST engine identify marginally failing cells in the memory and when two or more marginally failing cells are located in the same column, apply a spare column preferentially to repair the failing cells.

An embodiment of a method for efficiently repairing an embedded DRAM having marginally failing cells includes the steps of identifying marginally failing cells in the DRAM by controlling a variable and observing a condition of the cells in the DRAM, determining when the marginally failing cells share a common characteristic and in response to the determining, applying a select set of spare memory cells preferentially to repair the marginally failing cells in the DRAM.

An embodiment of a an alternative method for efficiently repairing embedded DRAM elements having marginally failing cells includes the steps of identifying a number of available redundant columns and a number of available redundant rows, setting a respective flag representing a state of repairability for each of a column and a row, applying a test pattern to the memory to identify failed cells, for each failed cell, recording a column address, decrementing a supply voltage by a predetermined voltage, identifying any additional failed cells in a column identified by the column address, wherein when an additional cell failure is identified in the column, marking the column for repair, decrementing the number of available redundant columns, incrementing the supply voltage by the predetermined voltage, repairing any column marked for repair, applying the test pattern to the memory under test to identify failed cells, for each failed cell, recording a row address, identifying any additional failed cell in a row identified by the row address, wherein when an additional cell failure is identified in the row, marking the row for repair, decrementing the number of available redundant rows, repairing any row marked for repair, applying the test pattern to the memory under test to identify failed cells, for each failed cell, use a redundant row to repair the failed cell, decrementing the number of available redundant rows until the available redundant rows are exhausted, wherein when available redundant columns have not been exhausted, using a redundant column to repair the failed cell and decrementing the number of available redundant columns.

The figures and detailed description that follow are not exhaustive. The disclosed embodiments are illustrated and described to enable one of ordinary skill to make and use the systems and methods for efficiently repairing embedded DRAM elements having marginally failing cells. Other embodiments, features and advantages of the systems and methods for efficiently repairing embedded DRAM elements having marginally failing cells will be or will become apparent to those skilled in the art upon examination of the following figures and detailed description. All such additional embodiments, features and advantages are within the scope of the systems and methods as defined in the accompanying claims.

BRIEF DESCRIPTION OF THE FIGURES

The systems and methods for efficiently repairing embedded DRAM elements having marginally failing cells can be better understood with reference to the following figures. The components within the figures are not necessarily to scale, emphasis instead being placed upon clearly illustrating the principles of identifying partial column failures and repairing the resulting marginally failing cells. Moreover, in the figures, like reference numerals designate corresponding parts throughout the different views.

DETAILED DESCRIPTION

Figure 1:
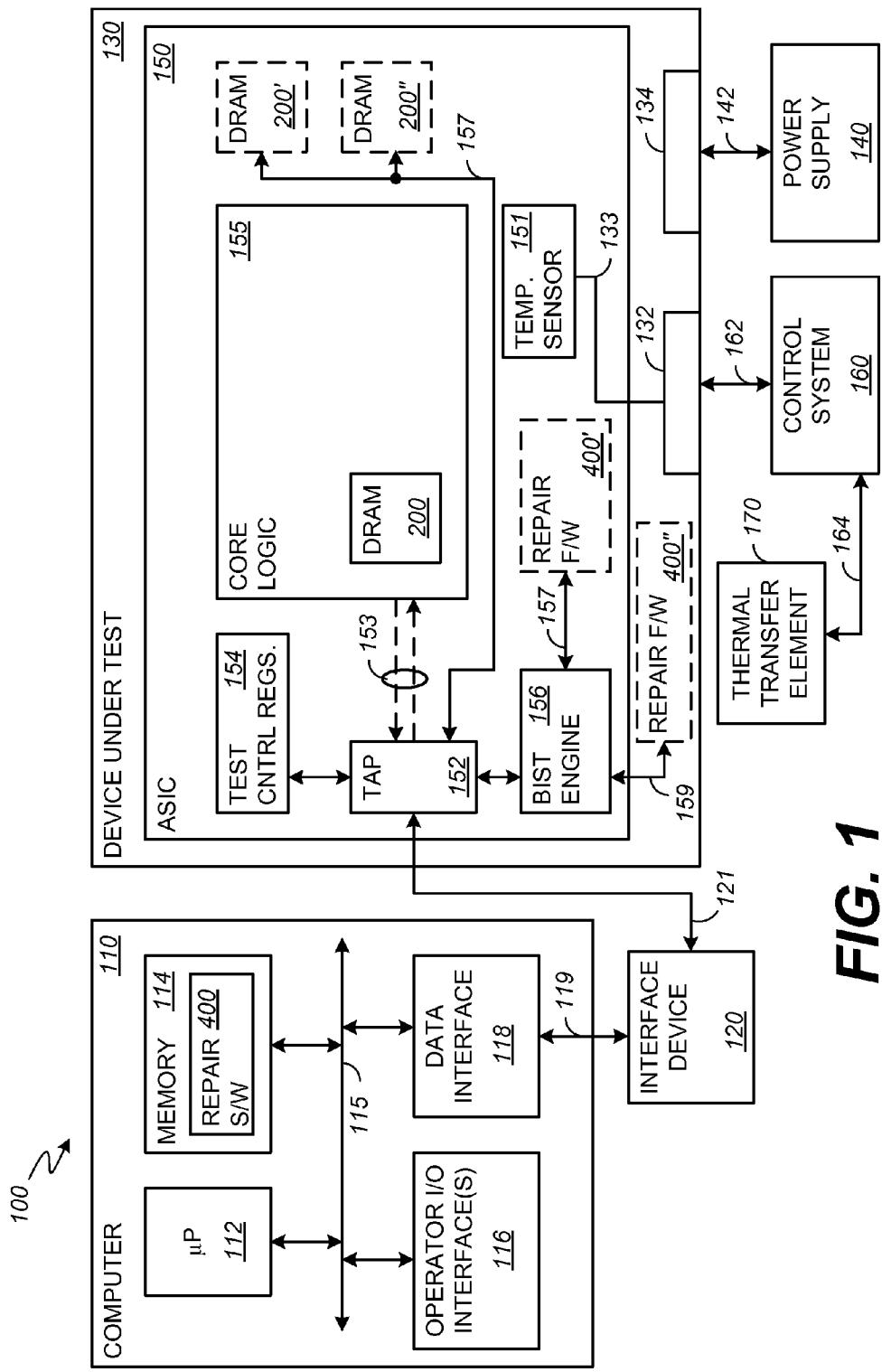
FIG. 1 is a functional block diagram of an embodiment of a test system for identifying and repairing embedded DRAM elements on an application specific integrated circuit.

The systems and methods for efficiently repairing embedded dynamic random-access memory (DRAM) having marginally failing bits provide a solution that identifies partial column failures and preferentially allocates scarce redundant resources for such partial column failures. The illustrated and described solution provides a more efficient use of limited redundant resources and improves production yields for application specific integrated circuits.

As the supply voltage is reduced to increase the operating speed and to decrease power consumed by application specific integrated circuits, new types of DRAM cell failures appear that are voltage and temperature dependent. It has been determined that some of these voltage and temperature dependent memory cell faults result from weak sense amplifier circuits in the memory. The cell location of bit faults change with voltage and temperature. However, the voltage and temperature dependent faults still line up along a column in a two-dimensionally arranged memory array. These somewhat random faults that share a common column are known as partial column failures.

When two or more marginally failing cells are located in the same column, indicating a partial column failure due to a weak sense amplifier associated with the column, the systems and methods apply a spare column preferentially to repair the failing cells in the column.

A test system can be arranged in a built-in self test (BIST) engine on the integrated circuit that houses the DRAM. In an alternative embodiment, the test system can be implemented in test equipment coupled to the integrated circuit that houses the embedded DRAM. Methods for efficiently repairing the embedded DRAM can be similarly implemented in executable instructions stored on or off the integrated circuit.

The repair software stores information identifying failed memory cells at multiple supply voltages. The repair software is suited for repairing two-dimensional memory arrays commonly provided in self-repairable DRAM designs that provide both row and column redundancy elements. The repair software is configured and operates under the assumption that column redundancy (i.e., a set of spare memory cells designated to replace DRAM cells identified by a common column address element) is a more scarce repair resource when compared to the relative availability of row redundancy (i.e., a set of spare memory cells designated to replace DRAM cells identified by a common row address element). An example DRAM element that can be repaired in accordance with the repair software may be arranged with a redundant column for each quadrant of an addressable memory cell array (i.e., four redundant columns per DRAM) and perhaps eight or more redundant rows that may be assigned or connected to replace a row within any quadrant of the DRAM element.

The repair software is suited for repairing DRAM elements that are associated or otherwise identified by a supply voltage window, within which the DRAM is expected to operate as designed with no failed cells. That is the DRAM element, after the repair, is expected to function nominally for the range of supply voltages within the supply voltage window.

The repair software takes advantage of a BIST that is able to scan a defined DRAM element in a fast row or a fast column addressing mode with provided start and end addresses. The repair software further takes advantage of a BIST that is capable of recording or otherwise identifying the cell locations of two or more failed memory cells at a given time.

The repair software compares the address information associated with memory tests that result from the application of two different supply voltages. The repair software applies a first supply voltage at or near the low limit of the supply voltage window. The addresses associated with failed cells are recorded. Thereafter, the DRAM is tested again after applying a second supply voltage that is lower than the supply voltage window by a predetermined voltage, which may vary depending on the process and or technology used to manufacture the DRAM element. When the supply voltage is reduced, additional cell failures may be observed. The repair software compares the failure information that results from the tests performed at the first supply voltage and the second supply voltage and applies column redundancy elements preferentially for failed cells that are indicative of an underlying column related defect or weakness. For example, and as described above, a sense amplifier that is used to "read" the stored bit value from memory cells that share a common column address may be sensitive to the change in the supply voltage at or near the low limit of the supply voltage window. Consequently, one or more additional cells may be identified as having failed as a result of the lower supply voltage. These additional failed cells may not be repeatable across multiple memory tests performed at or near the same first and second supply voltages. When one or more additional memory cells have failed in a column as a result of a change in the supply voltage, these marginally failing cells are preferentially repaired by replacing each memory cell or data storage element in the column with a redundant column of memory elements.

The test system and methods for efficiently repairing an embedded DRAM having marginally failing cells can be implemented in hardware, software, or a combination of hardware and software. When implemented using a combination of software and hardware, the test system and methods for measuring soft errors in an ASIC can be implemented using software or firmware and specialized hardware elements and logic. When the methods for measuring soft errors in an ASIC are implemented fully or partially in software, the software portion can be used to issue commands that enable data transfers to and from embedded memory elements on an ASIC. The software can be stored in a memory and executed by a suitable instruction execution system (microprocessor). The hardware implementation of the system and methods for measuring soft errors in an ASIC can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The repair software for repairing an embedded DRAM having marginally failing cells comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random-access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Turning now to the drawings, wherein like reference numerals designate corresponding parts throughout the drawings, reference is made to FIG. 1, which illustrates a functional block diagram of an embodiment of a test system 100 for identifying marginally failing memory cells in an embedded DRAM on an ASIC and repairing the same.

In the example embodiment, the test environment 100 includes a computer 110 and an interface device 120 that couples the computer 110 to a device under test 130. In the illustrated embodiment, the device under test 130 is a printed circuit board that includes an instance of an ASIC 150 that includes embedded DRAM 200.

The computer 110 is a general-purpose computing device. As illustrated, the computer 110 includes a microprocessor or processor 112, a memory 114, operator input/output interface(s) 116, and a data interface 118 that are coupled to one another via a local interface 115.

The local interface 115 can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, power and/or data connections to enable appropriate communications among the aforementioned components.

The processor 112 executes software stored in the memory 114 in accordance with commands and data received via the operator I/O interfaces 116, and the data interface 118. The memory 114 includes repair software 400 that when executed by the processor 112 sends appropriate data and commands via the data interface 118, the interface device 120, and a test access port (TAP) to DRAM 200 embedded in core logic 155 or located in portions of the ASIC outside of the core logic 155 as shown by DRAM 200' and DRAM 200".

The operator I/O interface(s) 116 include logic and buffers to enable an operator to communicate with the computer 110 using one or more of a keyboard, a speaker, a microphone, a display, a touch-sensitive display, a multiple-function pointing and selection device such as a mouse, etc.

The data interface 118 is an output port or physical interface through which information transfers in or out one bit at a time. Commercially available computing devices include multiple data interfaces implemented using one or more of the Universal Serial Bus (USB), RS-232, or parallel data port standards. The USB provides a mechanism for enabling two-way communication between the computer 110 and a peripheral device such as the interface device 120.

In the example embodiment, the interface device 120 receives commands and data in a first communication protocol from the computer 110 on connection 119. The received commands and data are converted within the interface device 120 from the first communication protocol to a second communication protocol. Commands and data are communicated on connection 121 to the TAP 152.

In an embodiment, the interface device 120 is configured to convert commands and data received in accordance with the USB communication protocol or standard to the Standard Test Access Port and Boundary-Scan Architecture for test access ports used for testing printed circuit boards using boundary scan (or I.E.E.E. 1149.1). Consequently, the interface device 120 is well suited for communicating and programming ASIC-based embedded systems. Example interface devices that convert USB compliant command and data signals to I.E.E.E. 1149.1 compliant signals are available commercially from numerous manufacturers.

In alternative embodiments, the interface device 120 could receive commands and data in accordance with other serial data transfer protocols (e.g., the RS-232 communication standard) or a modified parallel data transfer protocol. In these alternative embodiments, the translation or conversion of the received commands and data are communicated to the device under test 130 in accordance with the I.E.E.E. 1149.1 standard. Example interface devices that convert RS-232 compliant and/or parallel port compliant command and data signals to I.E.E.E. 1149.1 compliant signals are also available commercially from numerous manufacturers.

As indicated above, the device under test 130 is a printed circuit board configured with an ASIC 150. The device under test 130 further includes a connector 132 and a connector 134. An additional connector (not shown) receives commands and data from the interface device 120 along connection 121. The connection 121 is coupled to signal traces which provide the commands and data to the TAP 152 on the ASIC 150. The TAP 152 is configured to communicate serially based data using a technique specified in the IEEE 1149.1 standard. The connector 134 receives one or more regulated supply voltages along connection 142 from an adjustable power supply 140. The connector 134 is coupled to appropriately arranged supply and ground buses to distribute power to the ASIC 150. Adjustment of one or more of the supply voltage(s) provided by the power supply 140 to the ASIC 150 may be made via closed loop control when the power supply 140 is coupled to the computer 110. Alternatively, adjustment of supply voltage(s) can be performed by a test operator and one or more control inputs on the power supply 140.

The connector 132 receives one or more signals from a temperature sensor 151 arranged on the ASIC 150 and forwards the signals to a control system 160. In the illustrated embodiment, the temperature sensor 151 is integrated on the ASIC 150. In alternative embodiments, a temperature sensor may be arranged on the surface of a package that encapsulates the ASIC 150 or in close proximity to the ASIC 150. Adjustment of an ASIC core temperature or an ASIC case or housing sensed temperature may be made via closed loop control when the control system 160 is coupled to the computer 110 and to an appropriately configured thermal transfer element 170 (e.g., a heater or a cooler) connected to the control system 160 by the connection 164. Alternatively, adjustment of an ASIC core temperature or an ASIC case or housing sensed temperature can be performed by a test operator and one or more control inputs on the control system 160.

Although the device under test 130 or printed circuit board is shown with separate dedicated connectors, the various connections with external systems, power supplies and communication interfaces can be made through any combination of one or more connectors coupled to appropriately arranged signal traces on the printed circuit board.

In addition to the TAP 152, the ASIC 150 includes a set of test control registers 154, core logic 155, and a BIST engine 156. The set of test control registers 154 receive configuration information in the form of commands and data. The set of test control registers 154 are accessed via the TAP 152. The configuration information is used to access DRAM 200 within the core logic 155 via the bus 153, or external to the core logic 155 such as DRAM 200' and DRAM 200" through memory bus 157.

The BIST engine 156, working in conjunction with the TAP 152 and address logic within a select DRAM device such as the DRAM 200, is capable of accessing, that is, writing a logic "1" value or a logic "0" value to, or reading the same from, each distinct memory cell in the memory array 210. The BIST engine 156 can address a set of memory cells that share a common address element. That is, the BIST engine 156 can scan a row and/or a column of memory cells within the memory array 210 to read stored data from each memory cell. Similarly, the BIST engine 156 can write data values to a row and/or a column of memory cells within the memory array 210.

The BIST engine 156 may include one or more sets of executable instructions that apply a test data pattern to the addressable memory cells within the memory array 210. In addition, the BIST engine 156 is configured to identify any particular memory cell within the memory array 210 that has failed to store a data value that is consistent with the test data pattern. The test data pattern can be stored in either repair firmware 400', which is provided on the ASIC 150 and coupled to the BIST engine 156 by the connection 157, or in repair firmware 400" located on the device under test 130 or printed circuit board and coupled to the BIST engine 152 via one or more signal traces 159. In another alternative embodiment, the BIST engine 152 may include enough internal memory to store bit maps, test patterns, test instructions, as well as a set of executable instructions to enable the repair of failing memory cells within the DRAM 200. In addition to providing storage for one or more test patterns, the repair firmware 400' and or the repair firmware 400" can also store the executable logic in the repair software 400 to provide an autonomous DRAM repair mechanism.

Figure 2:
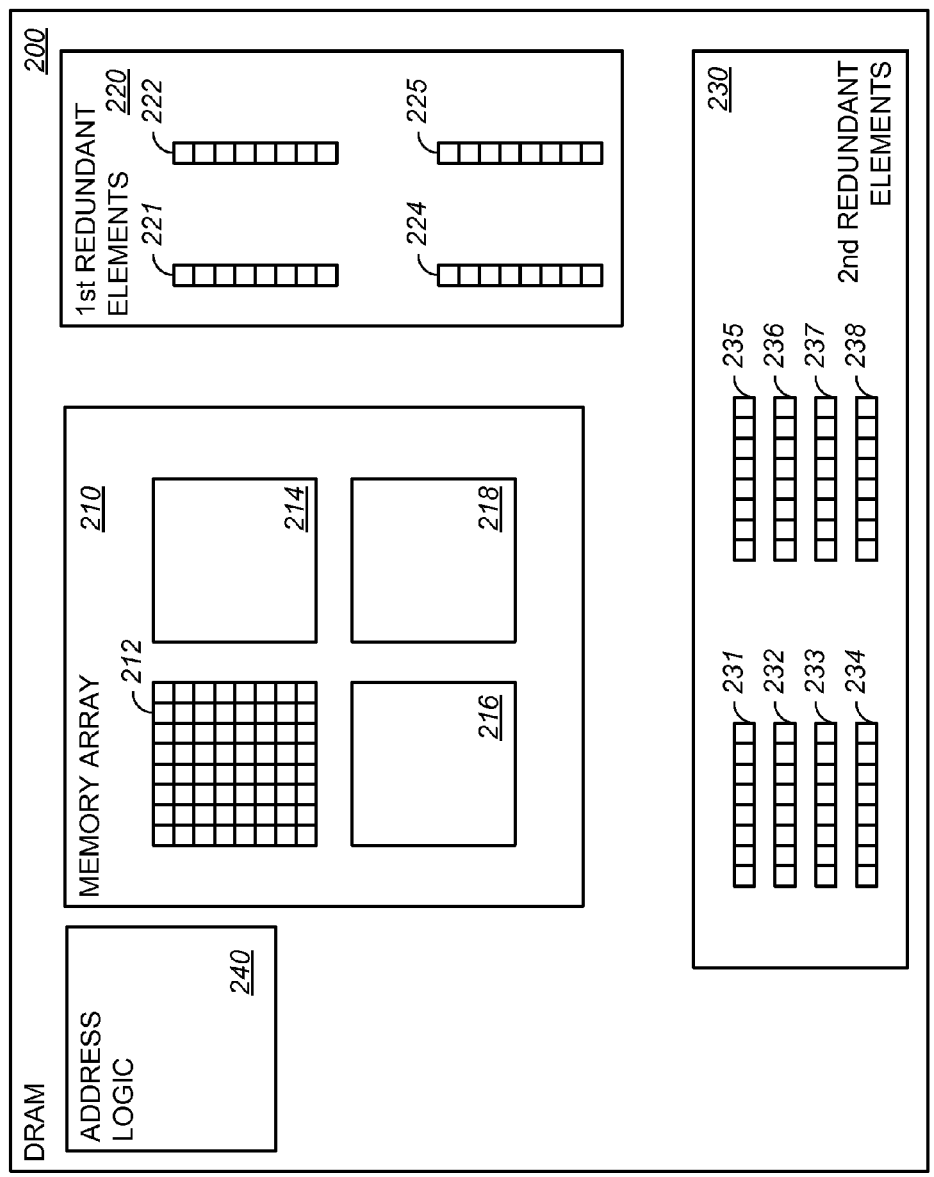
FIG. 2 is a schematic diagram illustrating an embodiment of the embedded DRAM elements of FIG. 1.

FIG. 2 is a schematic diagram illustrating an embodiment of an embedded DRAM element 200 of FIG. 1. The example DRAM 200 includes an addressable memory array 210, a first set of redundant elements 220, a second set of redundant elements 230 and address logic 240. In the illustrated embodiment, the memory array 210 is arranged in four quadrants of 64 bits arranged in eight rows of memory cells and eight columns of memory cells. A first quadrant 212 is arranged in the upper leftmost portion of the memory array 210. A second quadrant 214 is arranged in the upper rightmost portion of the memory array 210. A third quadrant 216 is below the first quadrant 212. A fourth quadrant 218 is below the second quadrant 214. It should be understood that the memory array 210 is not limited to the illustrated embodiment. For example, the memory array 210 may be subdivided into more or less separately addressable segments. By way of further example, a segment may include more or less memory cells. Furthermore, it is not necessary that the addressable segments are arranged symmetrically. That is, the memory array 210 may be arranged with a number of addressable segments that is other than a factor of 2. Moreover, it is not necessary that the addressable memory cells within a segment are arranged symmetrically. That is, an addressable segment may have more or less than eight separately addressable memory cells in each dimension.

The BIST engine 156 stores or otherwise identifies the location of such failed cells by recording a first address element and a second address element. In the example embodiment, the first address element identifies a set of memory cells arranged in a column, while the second address element identifies a set of memory cells arranged in a row. It should be understood that in an alternative embodiment, the first address element and the second address element can identify a row of memory cells and a column of memory cells, respectively.

The 1st redundant elements 220 and the 2nd redundant elements 230 together comprise a set or group of redundant memory elements that can be addressed by the address logic 240. The 1st redundant elements 220 includes a group of separately designated spare memory cells set aside for the repair (i.e., replacement) of a corresponding set of memory cells from the memory array 210. The 1st redundant elements 220 include a first set of redundant memory cells 221, a second set of redundant memory cells 222, a third set of redundant memory cells 223, and a fourth set of redundant memory cells 224. Each of the sets is arranged in a column. That is, each of the sets of redundant memory cells within the group of 1st redundant elements 220 is designated to repair or replace an entire column of memory cells in the memory array 210. This is accomplished in the address logic 240, by routing connections that would nominally be coupled to a select column in the memory array 210 to one of the first set of redundant memory cells 221, the second set of redundant memory cells 222, the third set of redundant memory cells 223, or the fourth set of redundant memory cells 224.

The 2nd redundant elements 230 includes a group of separately designated spare memory cells set aside for the repair (i.e., replacement) of a corresponding set of memory cells from the memory array 210. The 2nd redundant elements 230 includes a first set of redundant memory cells 231, a second set of redundant memory cells 232, a third set of redundant memory cells 233, a fourth set of redundant memory cells 234, a fifth set of redundant memory cells 235, a sixth set of redundant memory cells 236, a seventh set of redundant memory cells 237, and an eighth set of redundant memory cells 238. Each of the sets is arranged in a row. That is, each of the sets of redundant memory cells within the group of 2nd redundant elements 230 is designated to repair or replace an entire row of memory cells in the memory array 210. This is accomplished in the address logic 240, by routing connections that would nominally be coupled to a select row in the memory array 210 to one of the first set of redundant memory cells 231, the second set of redundant memory cells 232, the third set of redundant memory cells 233, the fourth set of redundant memory cells 234, the fifth set of redundant memory cells 235, the sixth set of redundant memory cells 236, the seventh set of redundant memory cells 237, or the eighth set of redundant memory cells 238.

The 1st redundant elements 220 and the 2nd redundant elements 230 together comprise a limited resource for repairing failed memory cells in the memory array 210. As indicated in the illustrated embodiment, the 1st redundant elements 220 is a more scarce resource for repairing failed memory cells when compared to the 2nd redundant elements 230. That is, there are more redundant rows than there are redundant columns available. An example DRAM 200 that can be repaired in accordance with the repair software 400 may be arranged with a single redundant column for each quadrant of an addressable memory cell array (i.e., four redundant columns per DRAM). As will be explained in further detail below, the repair software 400 is capable of managing the repair of the example DRAM 200 as well as other DRAM elements that are not so constrained in the application of redundant columns. In addition, an example DRAM 200 that can be repaired in accordance with the repair software 400 may be arranged with eight or more redundant rows that may be assigned or connected to replace a row within any quadrant of the DRAM element. As will be explained in further detail below, the repair software 400 is capable of managing the repair of the example DRAM 200 as well as other DRAM elements that are arranged with more or less redundant rows.

Figure 3:
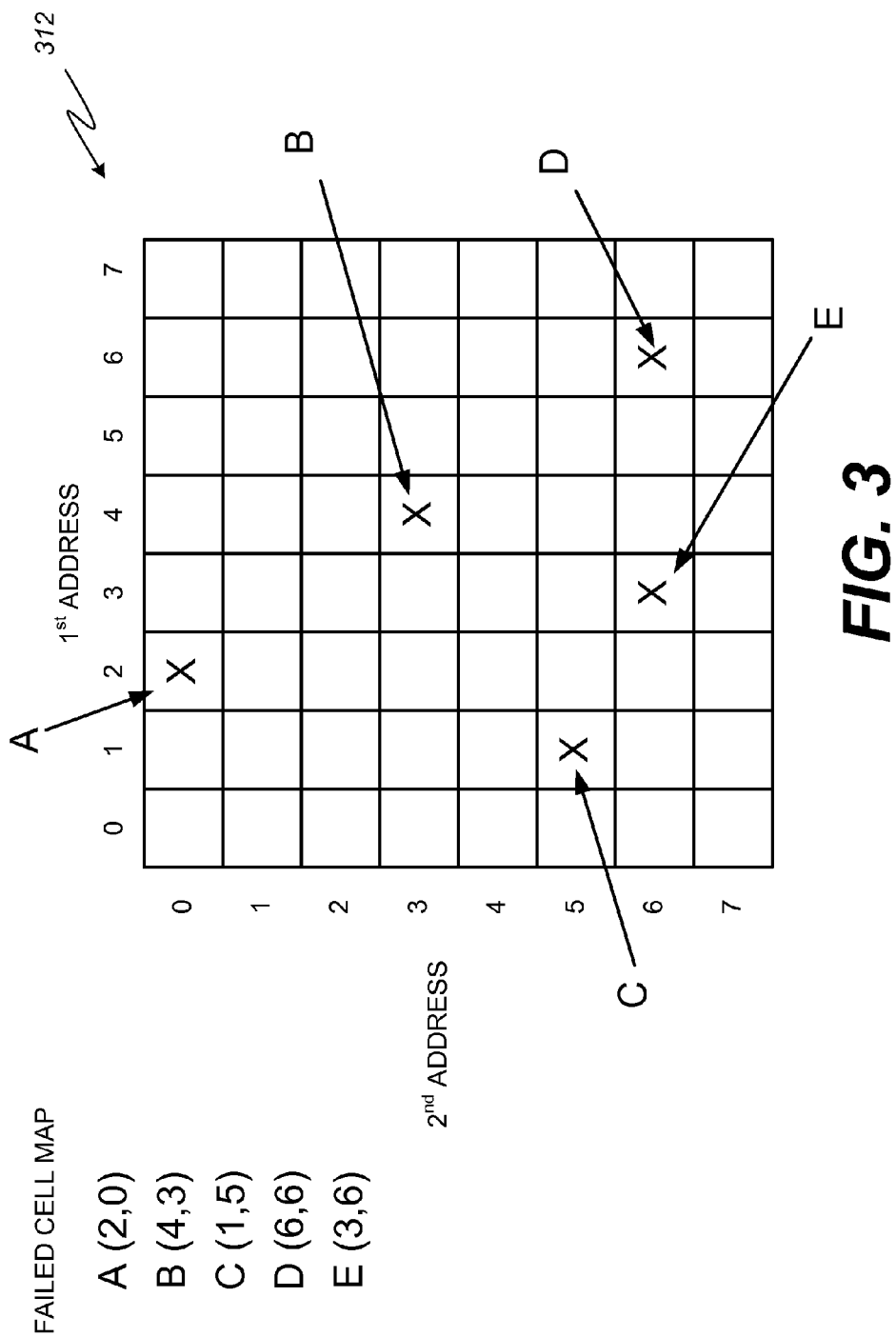
FIG. 3 is a schematic diagram illustrating an embodiment of a bit map representing failed cells in an embedded DRAM element of FIG. 1.

FIG. 3 is a schematic diagram illustrating an embodiment of a bit map 312 representing failed cells in an example embedded DRAM 200 of FIG. 1. The illustrated bit map 312 represents example results after the BIST engine 156 performs a test of the memory array 210 while applying a first supply voltage that is approximately equal to the lowest operating voltage under which the DRAM 200 is expected to function. The schematic illustrated in FIG. 3 represents the failed memory cells within the example DRAM 200 both graphically (by way of a grid) and via a table. As described above, conventional repair algorithms will treat each recorded failure as a "hard" or permanent failure of the corresponding memory cell.

In the center of the illustration, an 8×8 grid represents the location of a failed memory cell with the symbol "X." The grid shows a set of 8 columns that can be separately addressed by a 1st address ranging from 0 to 7. The grid further includes a set of 8 rows that can be separately addressed by a 2nd address ranging from 0 to 7. A first failed memory cell labeled "A" is indicated by the arrow that points to the cell identified by a 1st address element of 2 and a 2nd address element of 0. A second failed memory cell labeled "B" is indicated by the arrow that points to the cell identified by a 1st address element of 4 and a 2nd address element of 3. A third failed memory cell labeled "C" is indicated by the arrow that points to the cell identified by a 1st address element of 1 and a 2nd address element of 5. A fourth failed memory cell labeled "D" is indicated by the arrow that points to the cell identified by a 1st address element of 6 and a 2nd address element of 6. A fifth failed memory cell labeled "E" is indicated by the arrow that points to the cell identified by a 1st address element of 3 and a 2nd address element of 6.

The failed memory cell information illustrated in the 8×8 grid is also presented in a table to the left of the grid. The table includes the memory cell labels A through E and the address element pair associated with the location of the respective failed cell.

Although the example bit map representations illustrated in FIG. 3 illustrate a quadrant of the memory array 210 having an 8×8 grid of memory cells, it should be understood that the repair software 400 is not so limited. The repair software 400 is scalable to address memory arrays having any number of rows and columns of memory cells.

Figure 4:
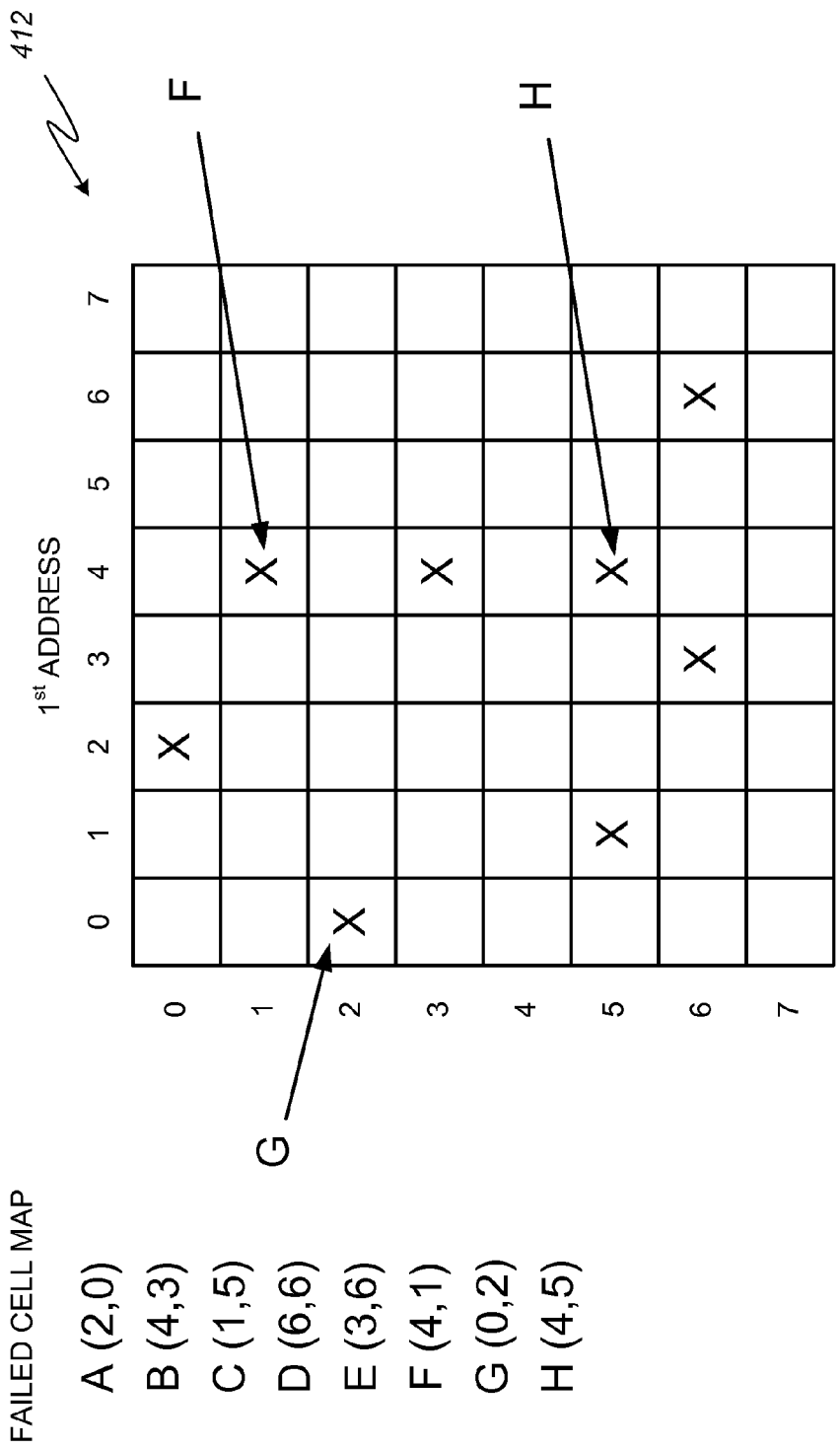
FIG. 4 is a schematic diagram illustrating an embodiment of a bit map representing a combination of failed cells and marginally failing cells in an embedded DRAM element of FIG. 1.

FIG. 4 is a schematic diagram illustrating an embodiment of a bit map representing a combination of failed cells and marginally failing cells in the embedded DRAM 200 of FIG. 1. The illustrated bit map 412 represents example results after the BIST engine 156 performs a test of the memory array 210 while applying a second supply voltage that is lower than the first supply voltage by a predetermined voltage. The predetermined change in voltage may vary from about 25 millivolts to about 50 millivolts depending on the semiconductor manufacturing process used to produce the DRAM 200. The application of the second supply voltage results in additional memory cell failures. The schematic illustrated in FIG. 4 represents the failed memory cells within the example DRAM 200 both graphically (by way of a grid) and via a table. The marginally failing cells are highlighted by way of the labels F, G, and H.

As described above, the repair software 400 will identify columns where multiple bit failures are indicated. The marginally failing bit labeled "G", which appears as the lone failure in the column identified by 1st address element 0, is ignored for repair, because the failed memory cell is the only memory cell failure in the column and the failure was observed outside the supply voltage window. The appearance of memory cell failures at the locations indicated by the labels "F" and "H" (in addition to the earlier observed failure labeled "B") is identified or otherwise marked for repair (i.e., replacement) by a redundant column since the additional failures at the lower supply voltage reveals an underlying weakness of the column identified by the 1st address element "4." The repair software continues to search for additional partial column failures across the memory array 210. Remaining sets of replacement memory cells designated for repair of columns (i.e., the 1st redundant elements 220) are applied by the repair software to replace any additional partial column failures. Once the 1st redundant elements 220 are exhausted, 2nd redundant elements are applied by the repair software 400 to rows where multiple failures are observed. The remaining random failures, that is, those failures that do not share a column or row address with another failed memory cell are repaired with any remaining 2nd redundant elements and any remaining 1st redundant elements.

In the center of the illustration, an 8×8 grid represents the location of a failed memory cell with the symbol "X." A first marginally failing memory cell labeled "F" is indicated by the arrow that points to the cell identified by a 1st address element of 4 and a 2nd address element of 1. A second marginally failing memory cell labeled "G" is indicated by the arrow that points to the cell identified by a 1st address element of 0 and a 2nd address element of 2. A third marginally failing memory cell labeled "H" is indicated by the arrow that points to the cell identified by a 1st address element of 4 and a 2nd address element of 5. The column identified by the 1st address element of "4" includes multiple failed memory cells. This column is repaired preferentially with a set of redundant or spare memory cells designated for repairing memory cells that share the characteristic of a common 1st address element. Stated another way, the partial column failure indicated by the failed memory cells F, B, and H is repaired first by the replacement of a redundant column of memory cells. The row identified by the 2nd address element of "6" includes multiple failed memory cells. This row is repaired next with a set of spare memory cells designated for repairing memory cells that share the characteristic of a common 2nd address element. Stated another way, the partial row failure indicated by the failed memory cells D and E is repaired by the replacement of a redundant row of memory cells. The remaining failed memory cells A and C are repaired with any remaining 2nd redundant elements 230 and 1st redundant elements 220, in that order.

The failed memory cell information illustrated in the 8×8 grid is also presented in a table to the left of the grid. The table includes the memory cell labels A through H and the address element pair associated with the location of the respective failed cell.

Figure 5:
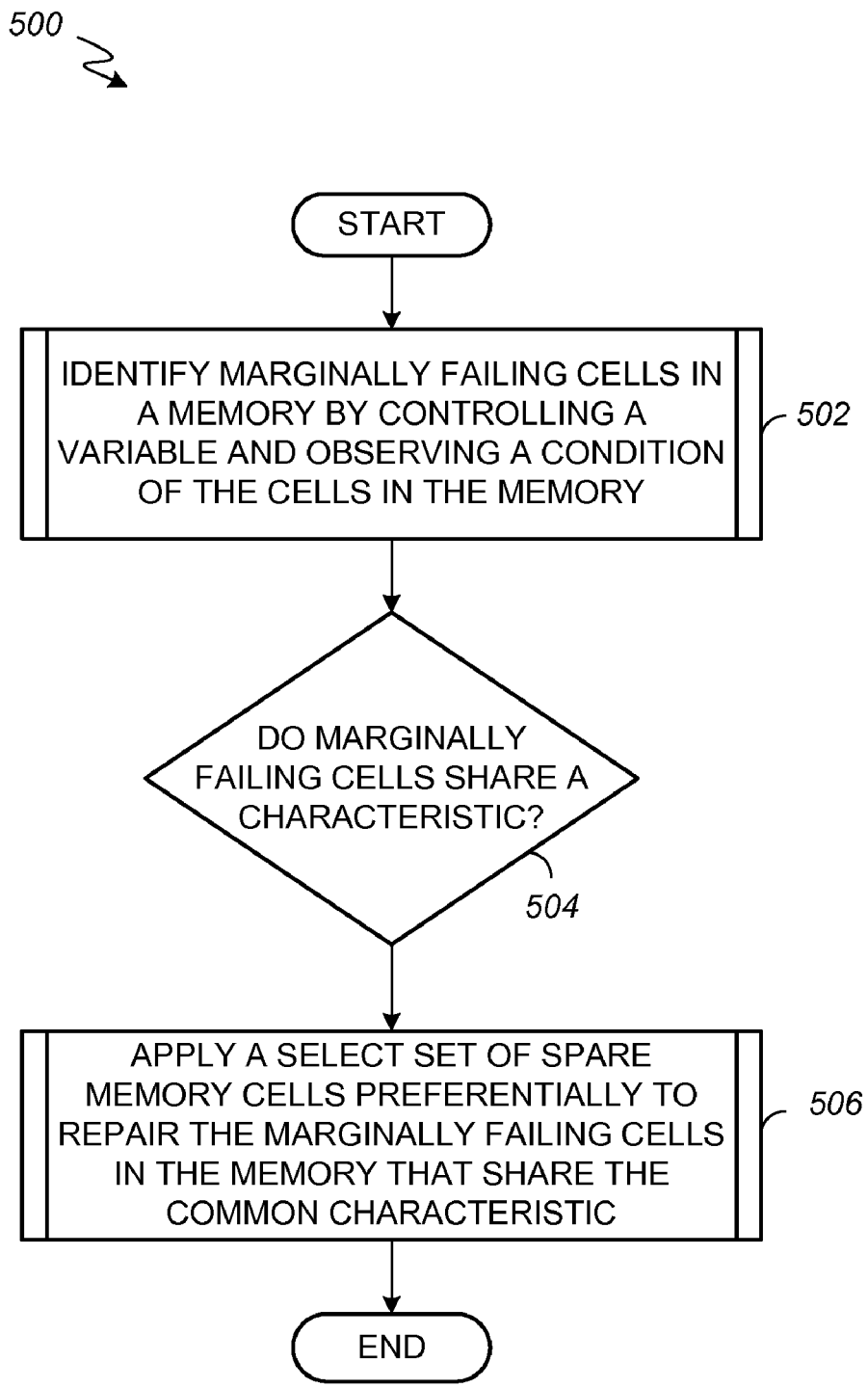
FIG. 5 is a flow diagram illustrating an embodiment of a method for efficiently repairing embedded DRAM elements having marginally failing cells.

FIG. 5 is a flow diagram illustrating an embodiment of a method 500 for efficiently repairing embedded DRAM elements having marginally failing cells. The flow diagram of FIG. 5 shows the architecture, functionality, and operation of an embodiment of the repair software 400 that identifies and preferentially repairs partial column failures in an embedded DRAM element on an ASIC. In this regard, each block represents a module, segment, or portion of code, which comprises one or more executable instructions for implementing the specified function(s).

The method 500 begins with block 502 where marginally failing cells in a memory are identified by controlling a variable and observing a condition of the cells in the memory. As described above, a BIST engine 156 is arranged to identify and access sets of memory cells in accordance with an address element. A first address element is associated with the relative position of a select memory cell in the memory array 210 from an origin in a first direction. A second address element is associated with the relative position of the select memory cell in the memory array 210 from the origin in a second direction that is orthogonal from the first direction.

In decision block 504 a determination is made whether marginally failing cells share a characteristic with other marginally failing cells. As described above, the method 500 identifies marginally failing cells identified in that they share a common address element associated with memory cells arranged in a column. Marginally failing cells in a column are indicative of a shared sense amplifier (a device that "reads" the stored data value from the memory) that is sensitive to the variable controlled in block 502.

Thereafter, in block 506 a select set of memory cells is applied preferentially to repair (i.e. replace) the marginally failing cells in the memory array 210 that share the common characteristic. Stated another way, a column in the memory array 210 that exhibits marginally failing bits or a partial column failure as a result of the application of a supply voltage or temperature that triggers memory cells to fail a BIST is replaced in the memory cell 210 by a redundant column before other repairs or replacements are made to the memory array 210.

Figure 6A:
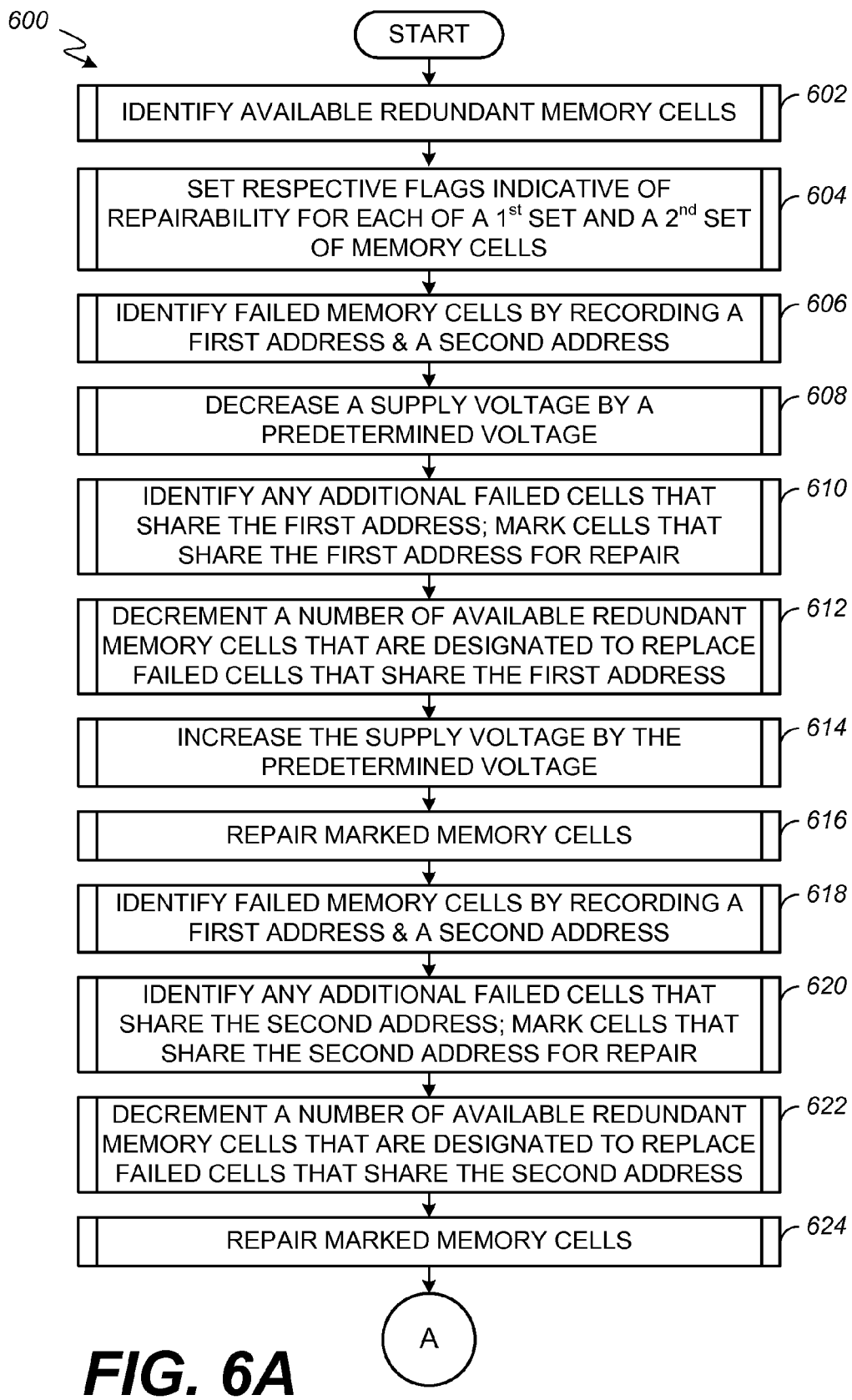
FIGS. 6A-6B include a flow diagram illustrating an alternative embodiment of a method for efficiently repairing embedded DRAM elements having marginally failing cells.
Figure 6B:
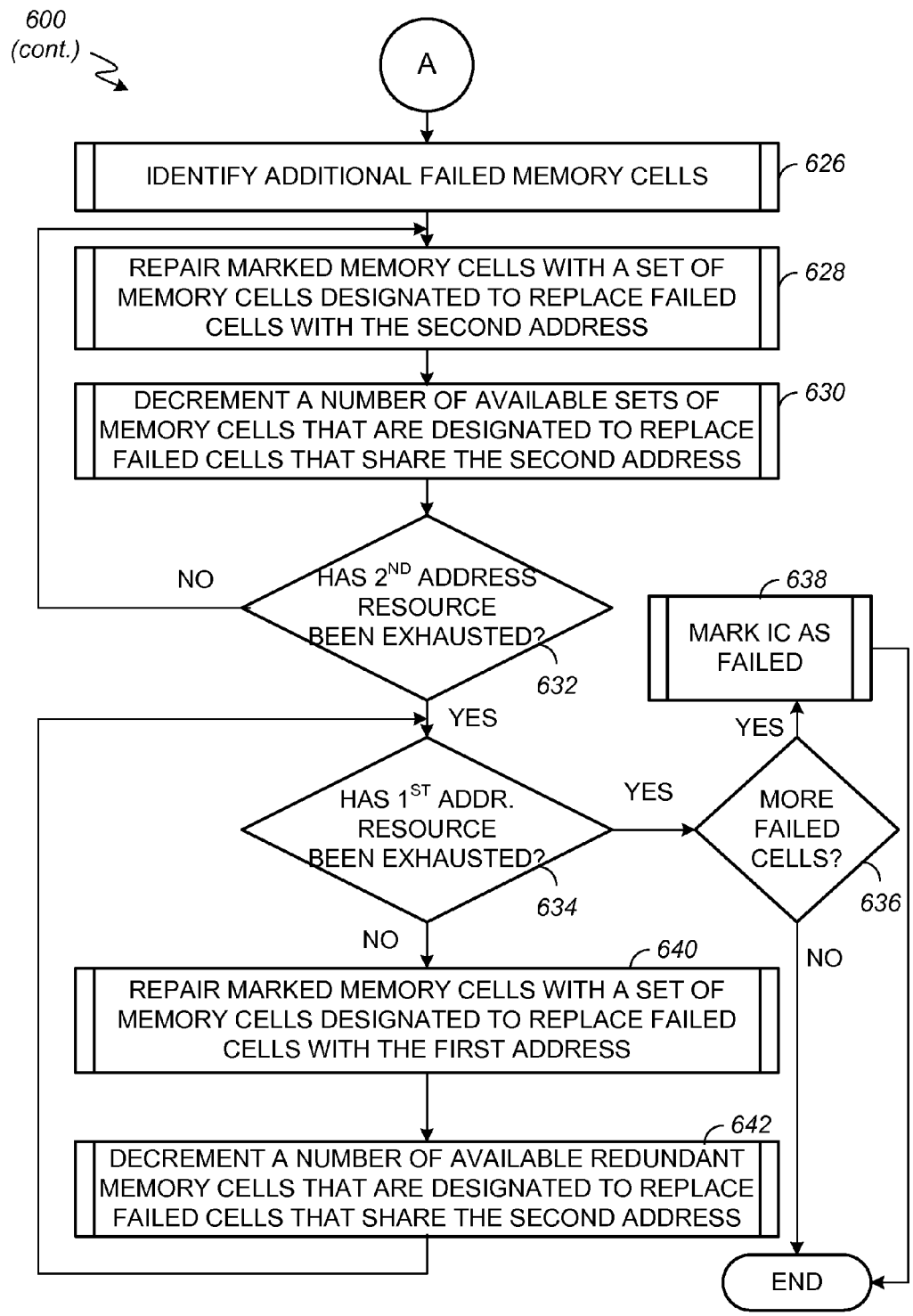

FIGS. 6A-6B include a flow diagram illustrating an alternative embodiment of a method 600 for efficiently repairing embedded DRAM elements having marginally failing cells. The flow diagram of FIG. 6 shows the architecture, functionality, and operation of an embodiment of the repair software 400 that identifies and preferentially repairs partial column failures in an embedded DRAM element on an ASIC. In this regard, each block represents a module, segment, or portion of code, which comprises one or more executable instructions for implementing the specified function(s).

The method 600 begins with block 602 where sets of available redundant memory cells are identified. As described above, a self-repairing DRAM element is configured with a first group of redundant elements containing sets of spare memory cells designated for replacing failed memory cells arranged in a column and a second group of redundant elements containing sets of spare memory cells designated for replacing failed memory cells arranged in a row. The identification step or process records a number of available redundant columns when redundant columns exist and a number of available redundant rows when redundant rows exist. In block 604, respective flags indicative of "repairability" of each of the first set of elements and a second set of elements in the memory array 210 are set. For example, a column repairability flag is set when the number of available redundant columns is greater than zero and a row repairability flag is set when the number of available redundant rows is greater than zero.

In block 606, failed memory cells are identified by recording a first address element and a second address element that together identify the relative position of the failed memory cell in the memory array 210. A failed memory cell is identified by the BIST as follows. If the BIST performs a read operation from a select memory cell and the data value returned from the memory cell is incorrect (i.e., not the data value that was written to the select memory cell), the select memory cell is identified as a failed cell. If the BIST performs a write operation to a select memory cell and the data value sent to the memory cell cannot be confirmed, then the select memory cell is identified as a failed memory cell. The BIST engine 156 keeps a record of the locations of the memory cells in a particular embedded DRAM element that fail.

In block 608, a supply voltage is decreased by a predetermined voltage. The change in voltage can vary depending on the semiconductor manufacturing process used to enable the DRAM. For example, the predetermined change in voltage can range from about 25 millivolts to about 50 millivolts. When an initial supply voltage is at or near the low limit of a supply voltage window, a decrease of 25 millivolts can result in additional memory cell failures in the memory array 210. In block 610, any additional failing cells are identified by repeating a BIST of the memory array 210 and recording the first and second addresses of the same. As further indicated in block 610, the repair software 400 marks or otherwise identifies those failed memory cells that share a first address identifier for repair. For example, as shown in the bit map of FIG. 4, the column with a first address identifier of 4 includes multiple bit failures after the supply voltage change Consequently, column 4 is marked for repair by a redundant column In block 612, the number of available redundant columns identified in block 602 is decremented, that is, decreased by one. In block 614, the supply voltage is increased by the predetermined voltage to return the supply voltage to a level where the DRAM is expected to function nominally In block 616, the column marked for repair is replaced by an available redundant column. When more than one column is identified as having marginally failing memory cells and when more than one redundant column is available, the repair software will replace the columns with the partial column failures with redundant columns during this phase of the repair and will decrement the number of available redundant columns accordingly.

In block 618, the BIST is repeated to identify failed memory cells within the memory array 210. As indicated in block 620, the repair software 400 identifies when two or more failed cells share a second address element. That is, the repair software 400 identifies when two failed memory cells are located in the same row. When this is the case the row is marked for repair or replacement by a redundant row. In block 622, the repair software 400 decrements the number of available redundant rows identified in block 602. In block 624, the row(s) marked for repair are replaced by an available redundant row. When more than one row is identified as having multiple failed memory cells and when more than one redundant row is available, the repair software 400 will replace the rows with redundant rows during this phase of the repair and will decrement the number of available redundant rows accordingly.

As indicated by connector "A," processing continues with block 626 in FIG. 6B, where additional failed memory cells are identified. In block 628, these failed memory cells that are not in the same column or row as other identified failures are replaced with redundant rows. In block 630, the number of available redundant rows is decremented. In decision block 632, it is determined if the resource of available redundant rows has been exhausted. If not, processing continues by repeating the functions in blocks 628-632. If so, it is determined in decision block 634 if the resource of redundant columns has been exhausted. When no redundant columns remain, a determination is made in decision block 636 whether there are more failed memory cells. If so, as indicated by the flow control arrow labeled "YES" that exits decision block 636, the integrated circuit is marked "failed" and the repair process is terminated.

When it is determined in decision block 634 that the resource of redundant columns has not been exhausted, failed memory cells are repaired with redundant columns as indicated in block 640 and the number of available redundant columns is decremented as shown in block 642. As indicated by the flow control arrow exiting block 642, the functions of block 634, block 640, and block 642 are repeated until the redundant columns have been exhausted or until no failed cells remain in the memory array 210.

While various example embodiments of the systems and methods for efficiently repairing embedded dynamic random-access memory having marginally failing cells have been described, it will be apparent to those of ordinary skill in the art that many more embodiments and implementations are possible that are within the scope of this disclosure. Accordingly, the described systems and methods for efficiently repairing embedded dynamic random-access memory are not to be restricted or otherwise limited except in light of the attached claims and their equivalents.

What is claimed is:

1. A method for efficiently repairing embedded dynamic random-access memory having marginally failing cells, the method comprising:
identifying a number of available redundant columns and a number of available redundant rows;
setting a respective flag representing a state of repairability for each of a column and a row;
applying a test pattern to a memory under test to identify failed cells;
for each failed cell, recording a column address;
decreasing a supply voltage by a predetermined voltage;

identifying any additional failed cells in a column identified by the column address, wherein when an additional cell failure is identified in the column, marking the column for repair;
decrementing the number of available redundant columns;
incrementing the supply voltage by the predetermined voltage;
repairing any column marked for repair;
applying the test pattern to the memory under test to identify failed cells;
for each failed cell, recording a row address;
identifying any additional failed cell in a row identified by the row address, wherein when an additional cell failure is identified in the row, marking the row for repair;
decrementing the number of available redundant rows;
repairing any row marked for repair;
applying the test pattern to the memory under test to identify failed cells;
for each failed cell, use a redundant row to repair the failed cell;
decrementing the number of available redundant rows until the available redundant rows are exhausted, wherein when available redundant columns have not been exhausted, using a redundant column to repair the failed cell and decrementing the number of available redundant columns.

2. The method of claim 1, further comprising:
after decrementing the number of available redundant columns, determining if the supply of redundant columns is exhausted; and
when the supply of redundant columns is exhausted, changing the status of the flag representing the state of repairability for a column.

3. The method of claim 1, further comprising:
after decrementing the number of available redundant rows, determining if the supply of redundant rows is exhausted; and
when the supply of redundant rows is exhausted, changing the status of the flag representing the state of repairability for a row.

4. The method of claim 1, wherein the step of identifying any additional failed cells in a column identified by the column address comprises an incremental check of each row until a maximum number of rows.

5. The method of claim 1, wherein the step of identifying any additional failed cells in a row identified by the row address comprises an incremental check of each column until a maximum number of columns.

6. The method of claim 1, further comprising:
determining the status of the respective flags representing the state of repairability for each of a column and a row; and when the status of the respective flags indicates that available redundant columns and available redundant rows have been exhausted and failed cells remain, terminating the method.

7. The method of claim 6, further comprising:
associating a failed status with the embedded dynamic random-access memory.

8. The method of claim 7, further comprising:
scrapping an integrated circuit which includes the embedded dynamic random-access memory.

* * * * *